United States Patent
Yoshimura

(10) Patent No.: US 6,934,004 B2
(45) Date of Patent: Aug. 23, 2005

(54) EXPOSURE APPARATUS, SEMICONDUCTOR DEVICE MANUFACTURING METHOD, MAINTENANCE METHOD OF EXPOSURE APPARATUS, AND SEMICONDUCTOR MANUFACTURING FACTORY

(75) Inventor: Keiji Yoshimura, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 25 days.

(21) Appl. No.: 10/386,701

(22) Filed: Mar. 13, 2003

(65) Prior Publication Data

US 2003/0174298 A1 Sep. 18, 2003

(30) Foreign Application Priority Data

Mar. 18, 2002 (JP) ........................................ 2002-074522

(51) Int. Cl.$^7$ ................. G03B 27/68; G03B 27/42; G03B 27/32; G01B 11/00
(52) U.S. Cl. ............................ 355/52; 355/53; 355/77; 356/399
(58) Field of Search ....................... 355/52, 53, 67, 355/69, 70, 71, 77; 356/399, 400, 401

(56) References Cited

U.S. PATENT DOCUMENTS

| | | | |
|---|---|---|---|
| 5,243,377 A | * | 9/1993 | Umatate et al. ............... 355/53 |
| 5,581,324 A | | 12/1996 | Miyai et al. ................... 355/53 |
| 5,883,701 A | | 3/1999 | Hasegawa et al. ............. 355/53 |
| 5,898,477 A | | 4/1999 | Yoshimura et al. ............ 355/53 |
| 5,914,773 A | | 6/1999 | Kurosawa et al. ............. 355/53 |
| 6,204,911 B1 | | 3/2001 | Kurosawa et al. ............. 355/53 |
| 6,383,940 B1 | | 5/2002 | Yoshimura ................... 438/708 |
| 6,424,405 B2 | | 7/2002 | Kurosawa et al. ............. 355/53 |
| 2001/0028443 A1 | * | 10/2001 | Yabu ............................ 355/30 |

FOREIGN PATENT DOCUMENTS

| | | |
|---|---|---|
| JP | 1-039726 | 2/1989 |
| JP | 6-349703 | 12/1994 |

* cited by examiner

*Primary Examiner*—Alan Mathews
(74) *Attorney, Agent, or Firm*—Fitzpatrick, Cella, Harper & Scinto

(57) ABSTRACT

An exposure apparatus includes a measurement device for measuring a distortion of an image of a reticle formed on a substrate by scanning exposure, a calculation device for calculating a position compensation parameter for each distortion, by separating the measured distortion into a symmetrical component and an asymmetrical component, and a control device for controlling scanning of either the reticle or the substrate based on the position compensation parameter calculated by the calculation device.

34 Claims, 14 Drawing Sheets

FIG. 12

| URL | http://www.maintain.co.jp/db/input.html |

TROUBLE DB INPUT SCREEN

| DATE | 2000/3/15 | ~1404 |
| MODEL | ********* | ~1401 |
| TITLE | OPERATION ERROR (STARTUP ERROR) | ~1403 |
| MACHINE S/N | 465NS4580001 | ~1402 |
| URGENCY LEVEL | D | ~1405 |

SYMPTOM: LED KEEPS BLINKING AFTER POWER IS TURNED ON ~1406

TROUBLESHOOTING METHOD: TURN ON POWER AGAIN (PRESS RED BUTTON WHEN STARTING UP THE MACHINE) ~1407

FOLLOW-UP: PROBLEM PROVISIONALLY SOLVED ~1408

[SEND] [RESET]   1410   1411   1412

LINK TO DATABASE OF RESULT LIST   SOFTWARE LIBRARY   OPERATION GUIDE

SEMICONDUCTOR DEVICE MANUFACTURING FLOW

EXPOSURE APPARATUS, SEMICONDUCTOR DEVICE MANUFACTURING METHOD, MAINTENANCE METHOD OF EXPOSURE APPARATUS, AND SEMICONDUCTOR MANUFACTURING FACTORY

FIELD OF THE INVENTION

The present invention relates to an exposure apparatus for performing distortion compensation, and a semiconductor device manufacturing method using the exposure apparatus.

BACKGROUND OF THE INVENTION

In a conventional exposure apparatus employing a step-and-focus method, a predetermined exposure process is performed while a wafer subjected to exposure is brought to a stationary state. Therefore, by compensating, prior to the exposure process, for distortion components generated when a mask image is transferred onto the wafer, distortion generation can be prevented. For instance, Japanese Patent Application Laid-Open No. 01-039726 discloses a method of compensating for a distortion by a characteristic of a lens used in exposure processing. Furthermore, Japanese Patent Application Laid-Open No. 06-349703 discloses a method of monitoring heat generated by exposure or temperature variation in an environment at the time of exposure, and feeding the monitored results back to an exposure apparatus. Both of these methods take effects by performing distortion compensation immediately before an exposure process employing a step-and-focus method.

In the above-described exposure apparatus employing the step-and-focus method, since exposure is performed on one substrate, distortion compensation before exposure is possible, and the compensation effect is reflected on the substrate. On the contrary, in an exposure apparatus employing a step-and-scan method (scanning exposure apparatus), since an exposure area on the substrate changes with time, even if distortion compensation is performed prior to exposure as in the step-and-focus exposure apparatus, the compensation effect cannot be reflected on each exposure area. Note, in the following description with respect to a scanning exposure apparatus, a positional error (distortion in one shot) between a designed reticle image and a transferred image on a substrate in each shot, as well as a distortion of a background pattern caused by multiple exposure will be referred to as a "distortion."

Factors that disturb effectiveness of distortion compensation in the scanning exposure apparatus include a production error in a projection lens, uneven driving thrust of a reticle stage and a substrate stage, an influence of vibrations, and so forth. These are distortion generation factors unique to a scanning exposure apparatus.

In a case of driving unevenness of a reticle stage and a substrate stage at the time of scanning, exposure light is caused to be deflected by a bow of the stages, and the unevenness can be compensated for by measuring an influence of the bow of each stage and storing the data in advance. However, in a case wherein the unevenness is caused by uneven thrust of a stage-driving motor or vibrations of a mechanical system, the pattern of each distortion generation cannot be determined in detail unless the actuator is driven to perform actual scanning exposure.

Furthermore, in actually performing the scanning exposure, even if control parameters are compensated for at each position corresponding to the scanning exposure, an influence of distortion cannot be removed in many cases because the aforementioned factors conspire to influence the distortion in various ways. Therefore, conventionally, the compensation value for calculating a driving value is determined based on an empirical intuition of an operator of the exposure apparatus.

SUMMARY OF THE INVENTION

In order to solve the above problems, an exposure apparatus according to the present invention, which is capable of effective compensation of a distortion generated in each shot, is characterized by having the following configuration.

That is, the present invention provides an exposure apparatus comprising: measurement means adapted to measure, in a shot unit, a distortion between a reticle image formed on a reticle and a transfer image transferred onto a substrate, the distortion being generated in each shot of scanning exposure; calculation means adapted to calculate a position compensation parameter for each distortion component to minimize the distortion between the reticle image and the transfer image, by separating the distortion into a symmetrical component and an asymmetrical component based on a measurement result of said measurement means; and control means adapted to control, in a shot unit, positioning of the reticle and/or the substrate based on the position compensation parameter calculated by said calculation means.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 12 shows a specific example of a user interface;

DETAILED DESCRIPTION OF THE PREFERRED EMBODIMENTS

Preferred embodiments of the present invention will now be described in detail in accordance with the accompanying drawings.

<Configuration of Exposure Apparatus>

Figure 1:
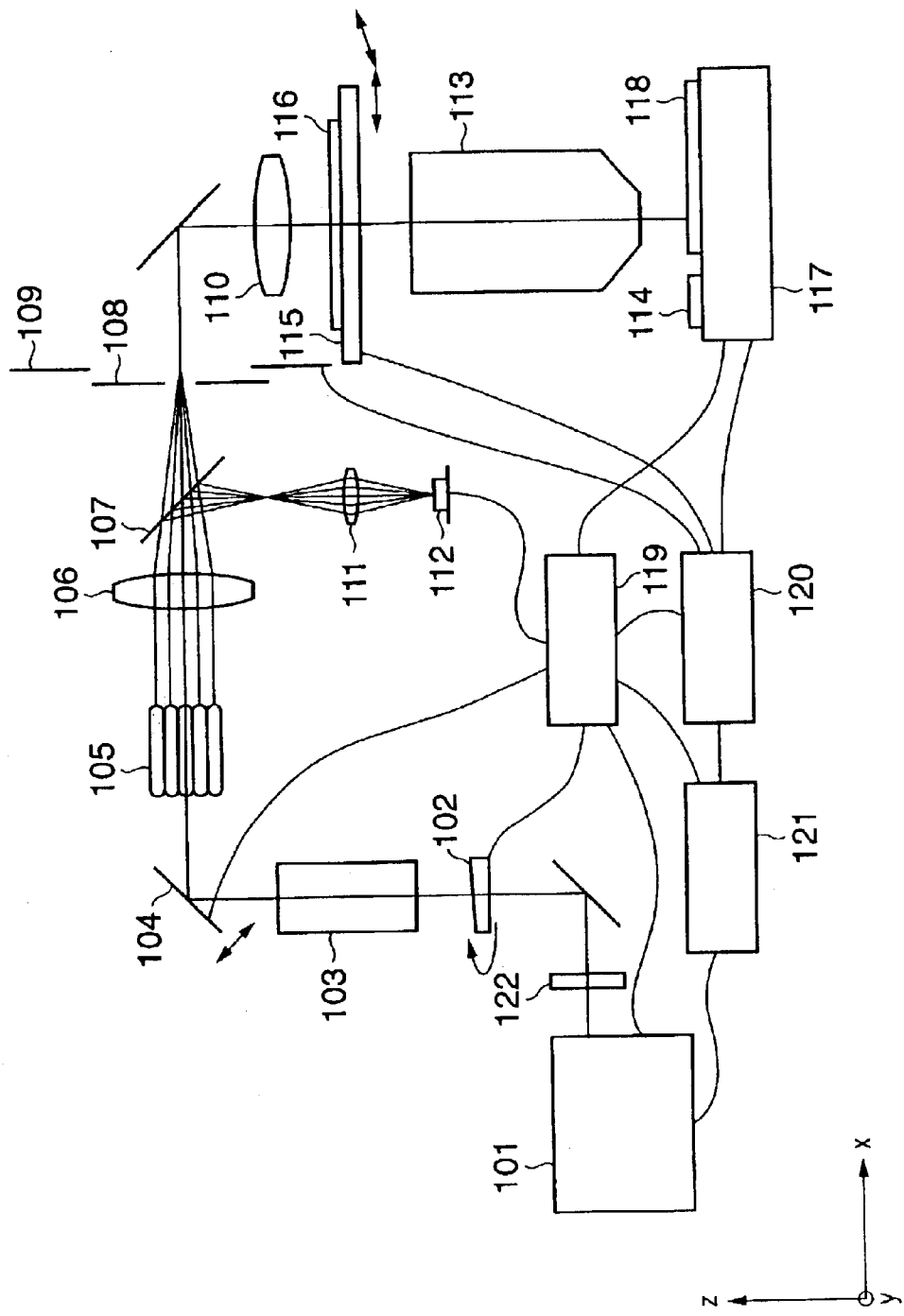
FIG. 1 is a view showing a brief configuration of a scanning exposure apparatus according to an embodiment of the present invention.

FIG. 1 shows a brief configuration of a scanning exposure apparatus according to an embodiment of the present invention. Referring to FIG. 1, reference numeral 101 denotes a light source, such as an excimer laser, an i-ray lamp, or the like. Numeral 122 denotes an optical member having a plurality of fading rates for attenuating light from the light source, which is represented by an ND filter having different transmissivities. Numeral 102 denotes an optical unit for eliminating illumination unevenness by oscillating an angle of coherent light, such as a laser beam. Numeral 103 denotes a beam-shaping optical system for performing beam shaping on the light from the light source 101 and making the light incoherent. Numeral 105 denotes an optical integrator. Numeral 106 denotes a condenser lens for illuminating the surface of a masking blade 109 with light fluxes from the optical integrator 105, which serves as a secondary light source.

Numeral 107 denotes a half mirror for dividing a part of the light fluxes from the optical integrator 105. The divided light flux is incident upon a light amount sensor 112 by a condenser lens 111 to be used for detecting the amount of exposure on a wafer 118. The light shielding blade (masking blade) 109 is constructed with four independently operating plates provided on the top, bottom, left and right, and located on an optically conjugate surface of a reticle 116 with respect to an image forming lens 110. An exposure slit 108 is constructed with two groups of light shielding plates, which block light fluxes in the direction perpendicular to an optical axis in the drawing. Since the slit 108 is provided at a position shifted from the surface of the masking blade 109 in the optical axis direction, a light intensity distribution of light fluxes that go through the slit 108 has a trapezoidal shape having its center on the optical axis.

The image forming lens 110 brings the light, which is blocked by masking, to the reticle 116 to form an image. A projection lens 113 projects the image, which is formed by the reticle, on the wafer 118. The reticle 116 is placed on a reticle stage 115 by positioning. The wafer 118 is placed on a wafer stage 117. Since each of these stages is driven in a suspended state by an air pad, or the like, they can be driven two-dimensionally, without restraint.

The amount of exposure on the wafer is detected and controlled by the light amount sensor (photodetector) 112. Further, an illuminometer 114 is attached to the wafer surface for determining in advance a relation between the illuminometer and the light amount sensor (photodetector) 112 prior to exposure, thereby enabling to provide a desired amount of exposure on the wafer surface.

An exposure apparatus I/F 121 is provided for inputting various conditions from an input device (e.g., a keyboard, a mouse, and the like) of the exposure apparatus I/F to specify operation conditions of the exposure apparatus. In addition, the I/F 121 controls wafer exposure conditions, exposure layouts, and the like, for an operator to select a desired condition for using the exposure apparatus. An operator can select a condition using the exposure apparatus from the exposure apparatus I/F 121. The exposure apparatus I/F 121 is connected to a backbone network where the exposure apparatus is installed, or a local network. Operation conditions of the exposure apparatus may be downloaded from these networks.

A main controller 112 executes various compensation functions of the exposure apparatus and drives or controls respective units in accordance with an operator's designation inputted from the exposure apparatus I/F 121 or a designation downloaded from the backbone network.

Hereinafter, a process for compensating for a distortion generated in each shot of scanning exposure will be described in detail. As the preliminary steps (S601 to S603 in FIG. 6) toward generating data for driving the actuator, or the like, in step S604 in FIG. 6, the compensation value is quantified taking the generated distortion amount and conditions (e.g., scanning speed) into consideration, and normal control data, which is obtained based only on the designed data, is corrected in the distortion compensation.

Figure 5:
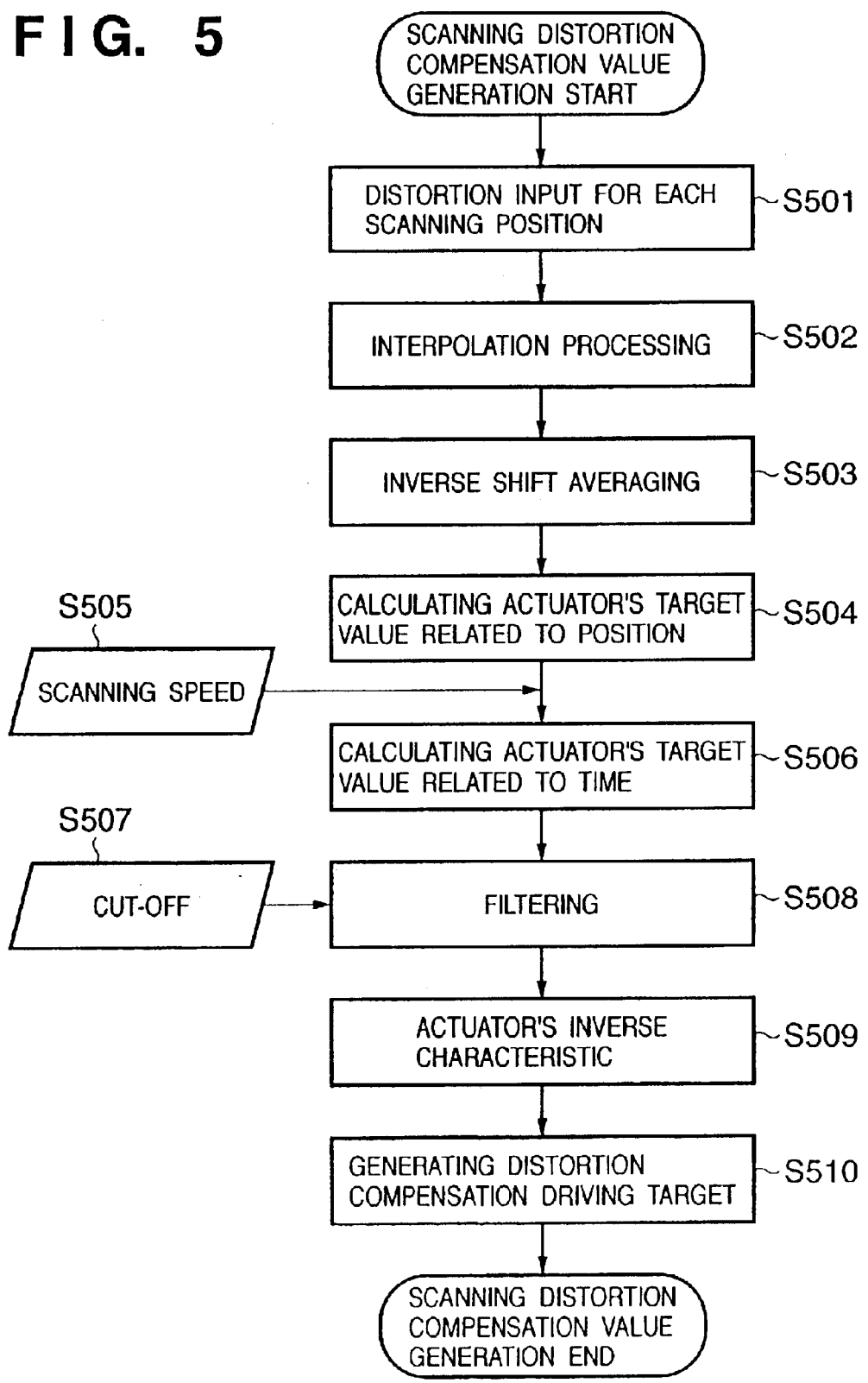
FIG. 5 is a flowchart describing generation of a stage driving target value for compensating for an asymmetrical distortion.

The aforementioned quantification includes two steps: separating a distortion component into symmetrical and asymmetrical components and generating distortion original data for calculating a parameter that minimizes a positional error for each of the symmetrical and asymmetrical components (FIG. 7); and generating a compensation value based on the data (FIG. 5). Details of these steps will be described hereinafter.

<Separating Components (symmetrical/asymmetrical) and Calculating Parameter>

To obtain distortion original data, marks of the reticle as a norm are exposed and transferred onto a substrate under a predetermined condition, and a distortion under this condition is obtained. On the reticle used in the exposure, a pattern (distortion marks) for measuring a distortion in the shot is formed in advance, and the distortion marks on the reticle are exposed onto the substrate by the step-and-scan method. In this stage, influences of a pattern drawing error of the reticle and a placement error of the reticle, or the like, are measured in advance, and the measured results are stored in a memory, which is not shown (this process corresponds to step S701 in FIG. 7). These error factors are data that cause inaccuracy in the distortion results.

In a case wherein the stage holding the reticle has an excellent driving precision, such error components can be absorbed by compensation driving of the stage, projection lens, an exposure light wavelength, and a distance between the reticle and substrate.

The substrate, on which the distortion marks of the reticle are exposed under the predetermined exposure condition, is measured by an external measurement device or a scope of the exposure apparatus, and an error between the designed position of the reticle marks and the drawing position of the reticle marks is obtained, taking the aforementioned placement error of the reticle into consideration. The measured positional error is the distortion of the shot.

Since errors in a reference coordinate of the measurement device and the coordinate system subjected to measurement are measured as distortion components (positional error), it is necessary to keep a correlation with the coordinate system of the exposure apparatus. Alternatively, exposure may be performed so that the first alignment marks and second alignment marks overlap with each other, and based on a distribution of the distortion amount of the marks, a distortion distribution for the shot can be measured. More specifically, a first layer is exposed by scanning exposure and stationary exposure, then a second layer is exposed by driving the substrate stage of the exposure apparatus, and a difference generated herein is obtained as a distortion. Note that in order to specify a final distortion amount, even in a case where a driving performance of the stage is assured for the shot and the stage is driven under various exposure conditions, it is preferable to specify the driving characteristic of the stage.

Figure 2A:
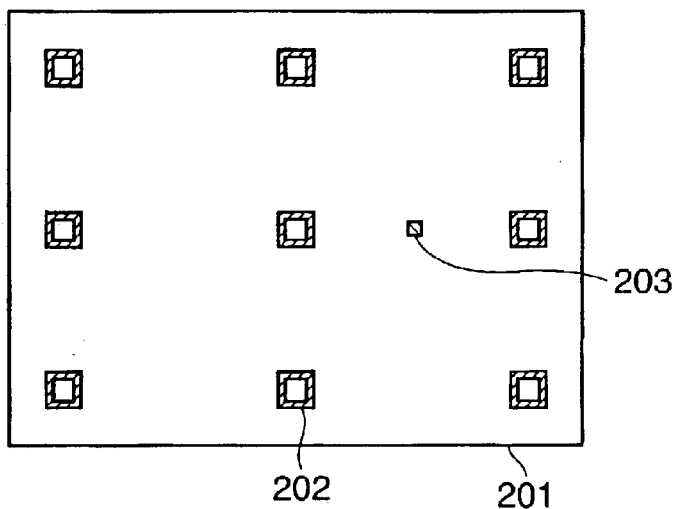
FIGS. 2A to 2C are explanatory views of a distortion measuring method, which measures a distortion by exposing marks 202 by performing block exposure, thereafter positioning the mark 203 by driving the stages and exposing the mark 203 with respect to the marks 202.
Figure 2B:
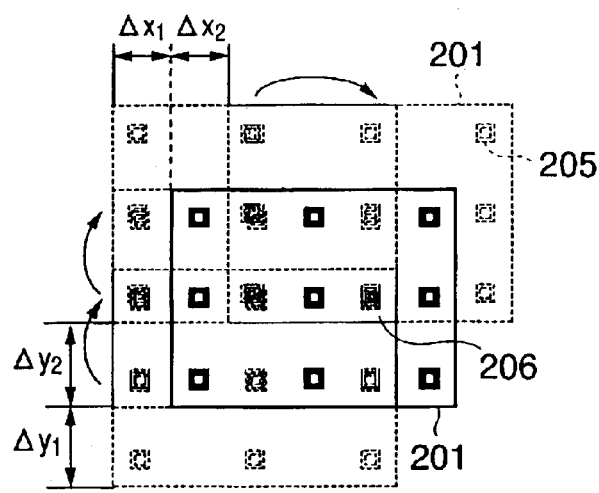
Figure 2C:
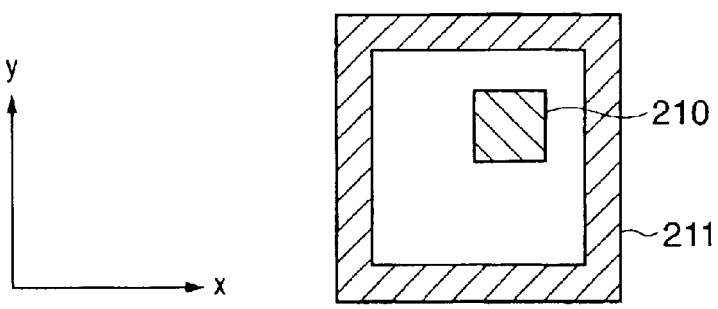

Hereinafter, a distortion measurement method is described with reference to FIGS. 2A to 2C. In FIG. 2A, reference numeral 201 denotes a distortion measurement reticle; and 202 and 203, examples of distortion marks provided on the reticle for distortion measurement. Stationary exposure and scanning exposure are performed using the reticle (first exposure) to transfer the distortion marks 202 and 203 onto a wafer. If a symmetrical distortion and an asymmetrical distortion are generated in this transfer, the distortion marks transferred onto the substrate are exposed at distorted positions that are different from the designed positions of the reticle marks.

Next, the reticle is shifted to place the designed position of the distortion mark 202 on the distortion mark 203, and exposure is performed (second exposure). To perform the second exposure for overlapping the two marks, for instance, the reticle 201 is shifted in the x direction ($\Delta$x1, $\Delta$x2, . . . ) and the y direction ($\Delta$y1, $\Delta$y2, . . . ) as shown in FIG. 2B, so that the marks 202 and 203 overlap with each other at a position 206, and multiple exposure is performed. If a distortion is generated as a result of this multiple exposure, the mark 210 is distorted from the center of the mark 211, as shown in FIG. 2C. The amount distorted from the center of the mark 211 is obtained as a distortion of this shot. Note that the distortion measurement method described above is an example, and the shapes of the marks used in the measurement are not limited to those shown in FIGS. 2A to 2C.

In order to compensate for the distortion measured in the above-described manner, the distortion is separated into a symmetrical distortion and an asymmetrical distortion. A symmetrical distortion is a distortion component of a projection image, which changes concentrically from one point, at each scanning exposure position. An asymmetrical distortion is a component other than the distortion components generated concentrically, and is caused by scanning at each position of the scanning direction, an error (shift) in the non-scanning direction, rotation, and the like.

In scanning exposure, since exposure light formed in a strip shape is used, calculation of the distortion needs to be performed in units of the area of the exposure light. Considered herein are the center-distortion amount (a, b) of the exposure light, rotation amount $\theta$ of the exposure light, and a function $1x^3+mx$ (parameters 1 and m are calculated by equations (1)–(3) described later) of the distortion amount in a state where exposure light is rotated. Each parameter is determined so as to minimize the square sum of differences between each of the measured positions and designed positions of the marks. The distortion component separation and parameter calculation correspond to step S704 in FIG. 7.

As described above, symmetrical distortions and asymmetrical distortions are separated from each other and a parameter for each distortion is determined. This parameter is the compensation value for compensating for the distortion. In other words, by obtaining the compensation value for compensating for each distortion, the symmetrical and asymmetrical distortions can be compensated for at respective positions of exposure light in the scanning exposure. For symmetrical distortions, the projection lens, a wavelength of exposure light, variations in a distance between the reticle and substrate in the optical axis direction, and the like, are compensated for. For asymmetrical distortions, since uneven driving thrust of the reticle stage and substrate stage is often the cause of the distortions, driving of the reticle stage or substrate stage is compensated for.

Furthermore, by setting various conditions such as scanning speed, or the like, obtaining distortions for each of the conditions, calculating parameters for compensation, and generating a database, it is possible to perform compensation in accordance with operation conditions of the exposure apparatus. This process corresponds to steps S702 and S705 in FIG. 7.

Figure 8A:
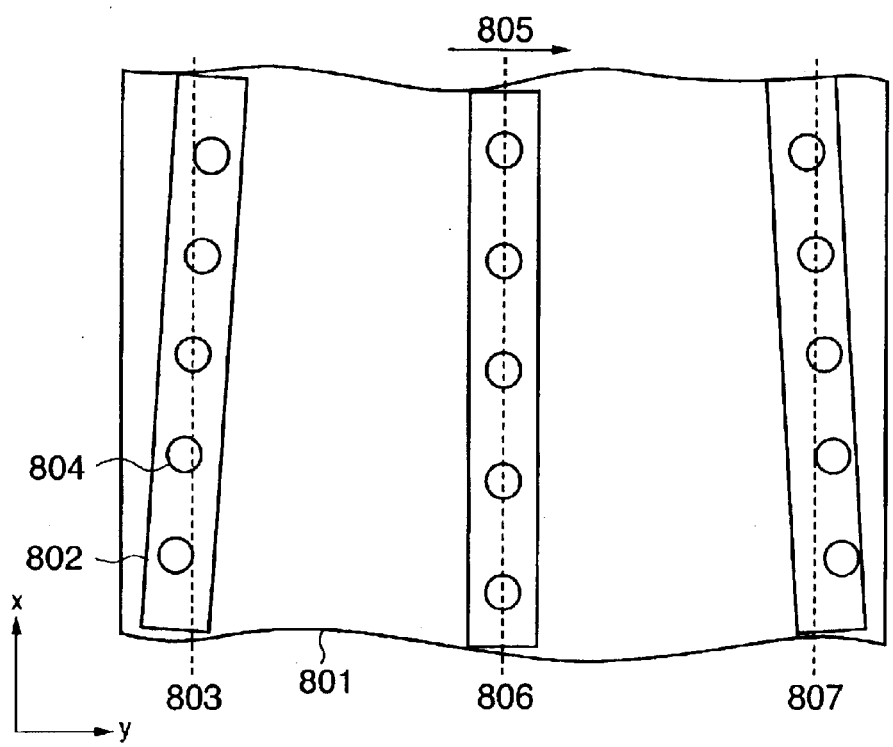
FIGS. 8A to 8C are explanatory views showing a distortion component separation in scanning exposure.
Figure 8B:
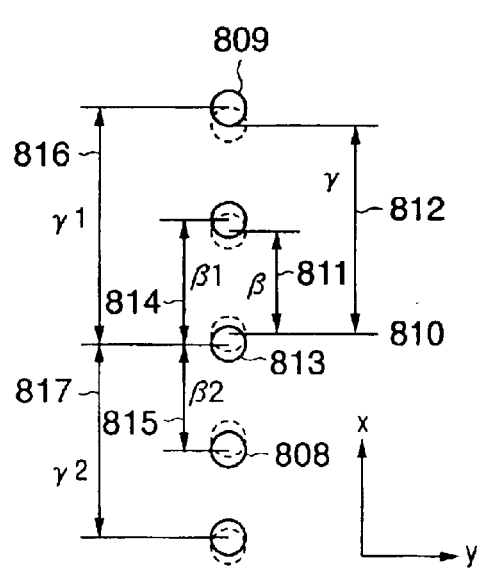
Figure 8C:
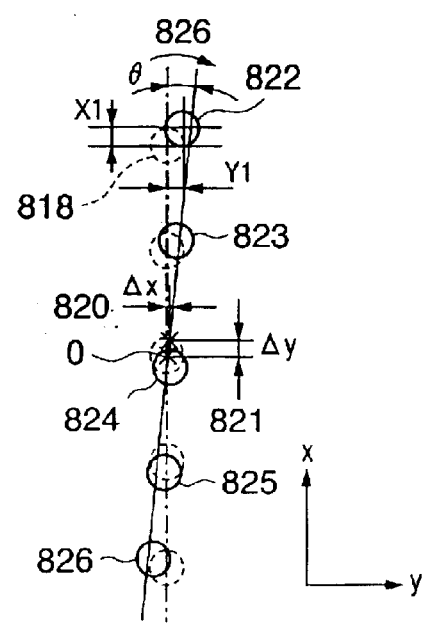

FIGS. 8A to 8C are explanatory views showing a basic idea of separating distortions in symmetrical and asymmetrical distortions. In FIG. 8A, an image is transferred at a position 803 by exposure light 802 formed in a strip shape, and predetermined distortion measurement marks 804 are exposed on the exposure target 801. When exposure at the position 803 is completed, the exposure control advances in the scanning direction 805 to perform the next scanning exposure at positions 806 and 807 in the similar manner. Assuming that the rotation amounts in the $\theta$ direction of the exposure at the positions 803, 806, and 807 are very small, a symmetrical component of distortions at each of the positions 803, 806, and 807 is calculated.

<Calculating Symmetrical Component>

Since the rotation amount is very small, an influence of an angle is disregarded, but only an error in the x direction or y direction is considered, as shown in FIG. 8B. FIG. 8B shows exposed distortion images 809 (solid line circles) in comparison with designed distortion marks 808 (dashed line circles). Both images are distorted in the x-axis direction. A space 811 between the designed distortion marks in the non-scanning direction (x direction in this case) is represented by a parameter $\beta$, and a designed space 812 is represented by $\gamma$. Assume that the designed distortion marks are arranged symmetrically with respect to the non-scanning direction. Herein, the distortion images (solid line circles) are formed at respective positions away from the central distortion image 813 by distance $\beta1$ (814), $\beta2$ (815), $\gamma1$ (816), and $\gamma2$ (817). Based on this position relation, the parameters 1 and m, which minimize the square sum C shown in the following equation (1), are calculated.

$$C = (\beta 1 - (1\beta^3 + m\beta))^2 + (\beta^2 - (1\beta^3 + m\beta^2))^2 + \qquad (1)$$
$$(\gamma 1 - (1\gamma^3 + m\gamma))^2 + (\gamma^2 - (1\gamma^3 + m\gamma))^2$$

$$\partial C / \partial 1 = -2\beta^3(\beta 1 - (1\beta^3 + m\beta)) - 2\beta^3(\beta^2 - (1\beta^3 + m\beta)) - \qquad (2)$$
$$2\gamma^3(\gamma 1 - (1\gamma^3 + m\gamma)) - 2\gamma^3(\gamma^2 - (1\gamma^3 + m\gamma)) = 0$$

$$\partial C / \partial 1 = -2\beta(\beta 1 - (1\beta^3 + m\beta)) - 2\beta(\beta^2 - (1\beta^3 + m\beta)) - \qquad (3)$$
$$2\gamma(\gamma 1 - (1\gamma^3 + m\gamma)) - 2\gamma(\gamma^2 - (1\gamma^3 + m\gamma)) = 0$$

Equations (2) and (3) partially differentiate equation (1) with respect to the parameters 1 and m. Parameters 1 and m satisfying the relation in these equations are calculated. The parameters 1 and m are the compensation value in the translational direction.

<Calculating Rotations Component>

Next, distortion compensation that takes an influence of rotation into consideration is described. The rotation amount $\theta$ (826) and the shift amount in the x and y directions (x (820), y (821)) at each of the positions 803, 806, and 807 in FIG. 8A are calculated. The rotation amount $\theta$ in FIG. 8C corresponds to an inclination of an alternate long and short dashed line passing the center point O, as indicated by an arrow 826. The central shift amount is a positional error generated in the horizontal (y) and vertical (x) directions of an actually transferred image, assuming the target positions (dashed line circles) as a reference.

The target positions, having no shift amount or rotation amount, are indicated by the dashed line circles in FIG. 8C. Least squares approximation is applied to the actually transferred image (solid line circles), in which a rotation amount and a shift amount are generated.

Regarding a distortion image 822 in comparison with a designed distortion mark 818, the shift amount in the x-axis direction is X1, and the shift amount in the y-axis direction is Y1. In the similar manner, the shift amounts of the distortion images 823, 824, 825, and 826 in the x-axis direction and y-axis direction are expressed by (X2, Y2), (X3, Y3), (X4, Y4), and (X5, Y5), respectively. A performance function indicated by the least square sum is calculated by equation (4).

$$C = (a + \gamma'\theta - X1)^2 + (b - Y1)^2 + \\ (a + \beta'\theta - X2)^2 + (B - Y2)^2 + (a - X3)^2 + (b - Y3)^2 + \\ (a - \beta'\theta - X4)^2 + (b - Y4)^2 + (a + \gamma'\theta - X5)^2 + (b - Y5)^2 \quad (4)$$

$$\partial C/\partial a = 2(a + \gamma'\theta - X1) + \\ 2(a + \beta'\theta - X2) + 2(a - \beta'\theta - X4) + 2(a - \gamma'\theta - X5) = 0 \quad (5)$$

$$\partial C/\partial b = 2(b - Y1) + 2(b - Y2) + 2(b - Y4) + 2(b - Y5) = 0 \quad (6)$$

$$\partial C/\partial\theta = 2\gamma'(a + \gamma'\theta - X1) + 2\beta'(a + \beta'\theta - X2) - \\ 2\beta'(a - \beta'\theta - X4) - 2\gamma'(a - \gamma'\theta - X5) = 0 \quad (7)$$

where $$\gamma' = 1\gamma^3 + m\gamma \quad (8)$$

$$\beta' = 1\beta^3 + m\beta \quad (9)$$

The parameters b and θ are calculated by equations (6) and (7), respectively, and these values are substituted into equation (5) to calculate the parameter a. These parameters a, b and θ are the compensation values that take rotation into consideration.

Note that a slit distortion amount (a, b) at each scanning position may be calculated as a positional error of the central mark. The above series of processes are performed with respect to each of the positions 803, 806, and 807 to separate distortions into symmetrical and asymmetrical components, and a parameter for each component is determined. Based on the parameters, it is possible to compensate for operation of each device, influenced by factors of the optical system, factors of the stages, or environmental factors that influence the exposure.

In other words, symmetrical and asymmetrical distortions can be compensated for at respective positions of exposure light in the scanning exposure. For symmetrical distortions, the projection lens, a wavelength of exposure light, variations in a distance between the reticle and substrate in the optical axis direction, and the like, are compensated for. For asymmetrical distortions, since uneven driving thrust of the reticle stage and substrate stage is often the cause of the distortions, driving of the reticle stage or substrate stage is compensated for.

<Distortion Compensation>

Scanning exposure is a method of exposing a reticle pattern on a substrate by sequentially exposing light, formed in a strip shape, at respective exposure positions of the reticle and substrate. In this method, in order to expose a particular point of the substrate, it is necessary to shift the stages by a non-scanning distance, corresponding to a distance in which exposure light is not irradiated, thereby positioning the reticle and substrate at predetermined positions. The shifting is performed for positioning the reticle and substrate at predetermined exposure positions. A distortion in one shot, which is generated by the scanning exposure, can be reworded as a shift amount error generated when the reticle and substrate are shifted by the non-scanning distance. Therefore, in order to compensate for the distortion generated in scanning exposure, it is necessary to calculate each driving target value, which is obtained by compensating for the error generated as a result of shifting the stages for the non-scanning distance, based on the measured distortion value.

Figure 3A:
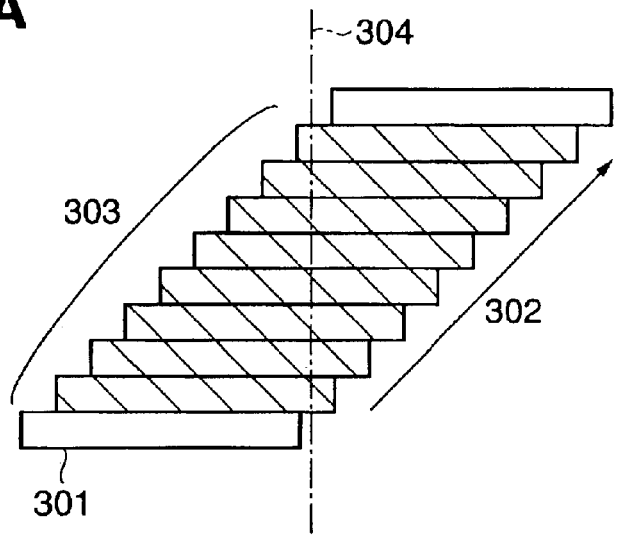
FIGS. 3A to 3C are conceptual views showing a state where a shift amount error is cumulatively generated in scanning exposure.
Figure 3B:
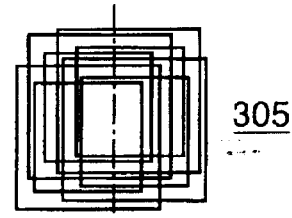
Figure 3C:
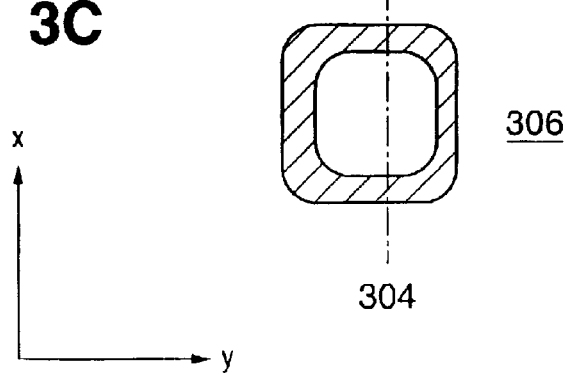

FIG. 3A is a conceptual view showing a state where the shift amount error is cumulatively generated in scanning exposure. Exposure light 301 is irradiated to an exposure target by scanning exposure, and the irradiation continues as the exposure position is shifted on the substrate as indicated by numeral 302 in FIG. 3A. As a result of plural times of scanning exposure 303, a mark at a position 304 (indicated by alternate long and short dashed lines) is transferred according to the shifted exposure light. If relative positions of respective exposure are distorted due to an uneven driving thrust of the stage which holds and drives the reticle or substrate, the mark at the position 304 is exposed with small distortions as indicated by numeral 305 (FIG. 3B). The state 305 is generated because reproduction of positioning is distorted in the plural times of scanning exposure due to a relative positional error of the reticle and substrate. If there is no positional error, the mark does not have multiple images, as in the state 305. Therefore, as a result of the exposure, a mark 306 having a distorted center is obtained (FIG. 3C).

Hereinafter, a description is provided of a method (inverse shifting averaging method) for compensating for an error generated as a result of shifting the stage for the non-scanning distance. A technique applicable as an inverse shift averaging method is to calculate back a control input of a system by inverse transformation of a system transfer characteristic, or to perform calculation by least squares approximation, or the like.

<Calculation Based on Transfer Characteristic>

A distortion generated in scanning exposure is obtained by integrating relative positional errors at respective positions of respective stages.

For instance, a distortion y(n) at a position n is obtained by the following equation, using a relative position error value d of the wafer stage and reticle stage.

$$y(n) = d(n+k) + d(n+k-1) \ldots + d(n) + \ldots + d(n-k+1) + d(n-k) \quad (10)$$

Herein, z-transformation is performed on equation (10).

$$Y = z^k D + z^{(k-1)} D + \ldots + D + \ldots + z^{-k+1} D + z^{-k} D \quad (11)$$
$$= (z^k + z^{k-1} + \ldots + 1 + \ldots + z^{-k+1} + z^{-k}) D$$
$$\therefore D/Y = z^k / (z^{2k} + z^{2k-1} + \ldots + z + 1)$$

Equation (11) calculates a driving value to be achieved at each scanning position based on a generated distortion. Substituting a generated distortion into this equation and calculating a driving value for compensating for a relative positional error realizes the inverse shift averaging employing a transfer characteristic. Note, when equation (11) is used, an output of the transfer function becomes unstable in the cycle corresponding to $z^k$. Therefore, it is necessary to cut the results corresponding to such portions.

<Calculation Using Mean Squares Method>

Assuming that a relative positional error at respective positions of the wafer reticle stage is d(x) and a width of exposure light in the scanning exposure is w, a positional error value y at a scanning position x can be expressed as follows:

$$y = \int d(x)dx \text{ (integration range } (x) \text{ is from } x-w/2 \text{ to } x+w/2) \quad (12)$$

$$= f(x) \quad (13)$$

By calculating equation (13) using a least squares method, or the like, and differentiating the result, the function d(x) in the equation (12) can be obtained. In actual calculation of f(x), it is necessary to take into consideration the fact that the equation becomes complicated and an error becomes large. Thus, it is realistic to divide the entire scanning area into sections, calculate f(x) for each of the sections, and combine the calculation results.

For instance, in a case where the scanning exposure area is 33 mm, the area is divided into four sections [0, 12], [7, 19], [14, 26], and [21, 33]. Calculation is performed using equation (13) for each of the sections, and the results are combined. The combined result is differentiated to calculate the function d(x).

Since a distortion is determined by the shift averaging method, particularly at shot edges, it is necessary to control movement of the stage at positions outside the shot. More specifically, the scanning position includes an area outside the exposure area.

When devices such as stages are driven to actually compensate for the distortion, it is necessary to consider dynamic characteristics of the actuator, which is driven with a compensation control value. The dynamic characteristics of the actuator include a frequency characteristic, a response rate, and the like. Gains and phase characteristics of the actuator change for each frequency of the control signals inputted to the actuator. In other words, even if a compensation position target value is determined for each scanning position by the inverse shift averaging and the target value is inputted to the actuator, in reality, the output waveforms distort due to the dynamic characteristics of the actuator. Therefore, it is necessary to input the driving value, taking the distortion into consideration.

Furthermore, when the scanning speed changes, a target frequency band of signals changes. Therefore, the driving value needs to be calculated in accordance with the scanning speed.

Note that the aforementioned actuator corresponds to the reticle or substrate which compensate for distortions of the exposure position's shift amounts a and b and rotation θ, the projection lens, which compensates for symmetrical distortions 1 and m, a wavelength of exposure light, and a distance between the reticle and substrate (driving characteristic of one of the stages in an optical-axis direction).

Figure 4A:
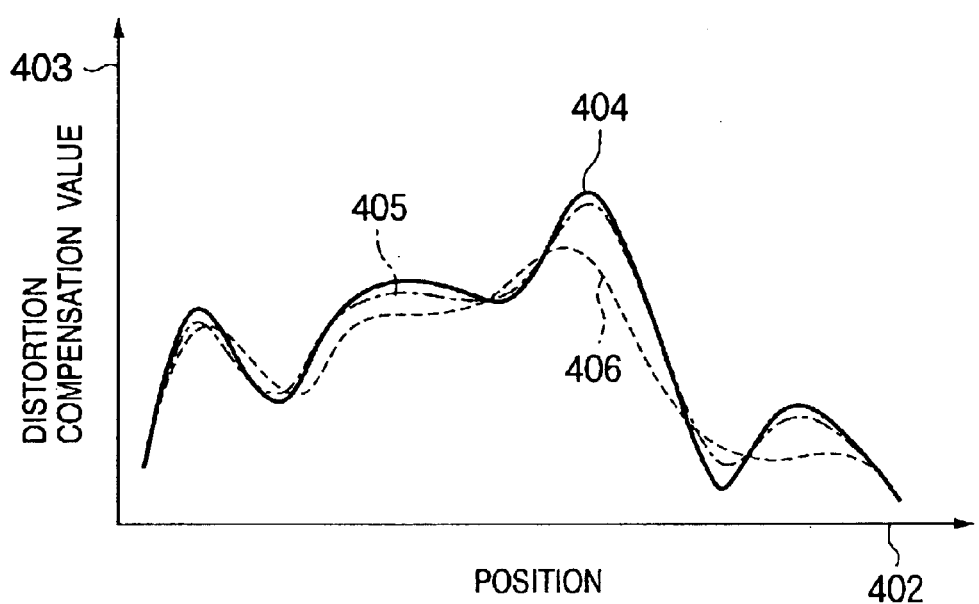
FIGS. 4A and 4B are graphs showing an example of distortion compensation of an actuator for driving stages.
Figure 4B:
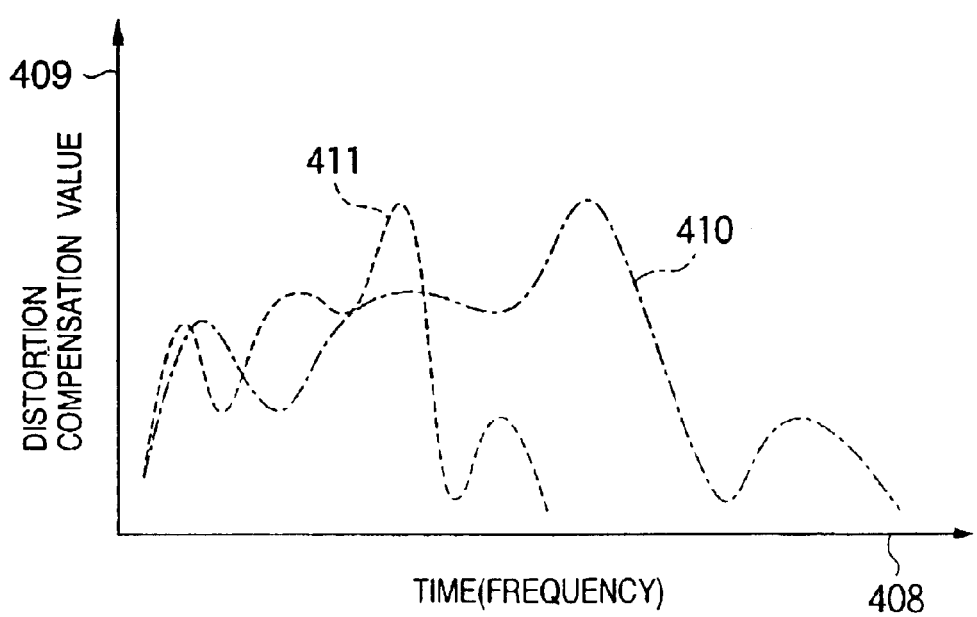

Next, a description is provided with reference to FIGS. 4A and 4B on a reason why it is necessary to calculate for a compensation value of driving stages for each scanning speed. FIGS. 4A and 4B are graphs showing an example of distortion compensation of an actuator for driving stages.

In FIG. 4A, an abscissa 402 indicates a position subjected to an exposure shot, and an ordinate 403 indicates a distortion compensation value, i.e., a compensation driving target value of the reticle or substrate. The solid line in FIG. 4A indicates a compensation target for respective positions; the alternate long and short dashed line 405 indicates a distribution of compensation values when the stage speed is low; and the dashed line 406 indicates a distribution of compensation values when the stage speed is higher than the speed of 405.

Even if the compensation driving target value (solid line) 404 for compensating for a distortion is inputted for controlling the stages, because of the dynamic characteristics of the stages (frequency characteristic, or the like), the output values of the stages result in the alternate long and short dashed line 405 and dashed line 406, which do not completely satisfy the target value 404. Further, when the stage speed increases, the frequency band of the time target value inputted to the stage increases, resulting in variations in the stage driving positions. As a result, the response 405 obtained when the stage speed is low is different from the response 406 obtained when the stage speed is high.

In FIG. 4B, an abscissa 408 indicates time and an ordinate 409 indicates a distortion compensation value. The alternate long and short dashed line 410 in FIG. 4B indicates a distribution of compensation values when the stage speed is low, and the dashed line 411 indicates a distribution of compensation values when the stage speed is higher than the speed of 410. It is apparent from the drawing that the line 411 obtained when the stage speed is high has a higher frequency in the time-axis direction than the line 410 obtained when the stage speed is low. Considering that the frequency characteristic of the stage changes, it is necessary to generate a stage driving target value, which prevents generation of a distortion, for each driving speed of the stages.

If a compensation driving target value is calculated for each scanning speed merely taking the dynamic characteristics of the actuator into consideration, it may become a factor of deteriorated synchronization precision of the reticle and substrate. Therefore, distortion compensation needs to be performed on a designated control band. In view of this, the control band of the actuator is left open for arbitrary setting, and distortion compensation is performed with a trade-off between the actuator's operation and synchronization precision.

Furthermore, since an influence imposed on synchronization precision changes depending on the type of actuators, it is preferable to set the control band for each actuator. In a case wherein there is a unit that cannot be driven during scanning exposure due to a performance of the actuator, the unit may be driven at an average value of the exposure area prior to the scanning exposure, or driven in advance so as to compensate for the worst value.

FIG. 5 is a flowchart showing a procedure for arbitrarily setting a control band of the actuator and compensating for an asymmetrical distortion with a trade-off of synchronization precision.

In step S501, measured distortions at respective scanning positions are inputted. Since the measured distortions are positionally discrete data, in step S502, interpolation processing is performed on the discrete data so that the following process can be performed. The data obtained by interpolation processing is considered when compensating for the shift for the non-scanning distance.

Figure 9:
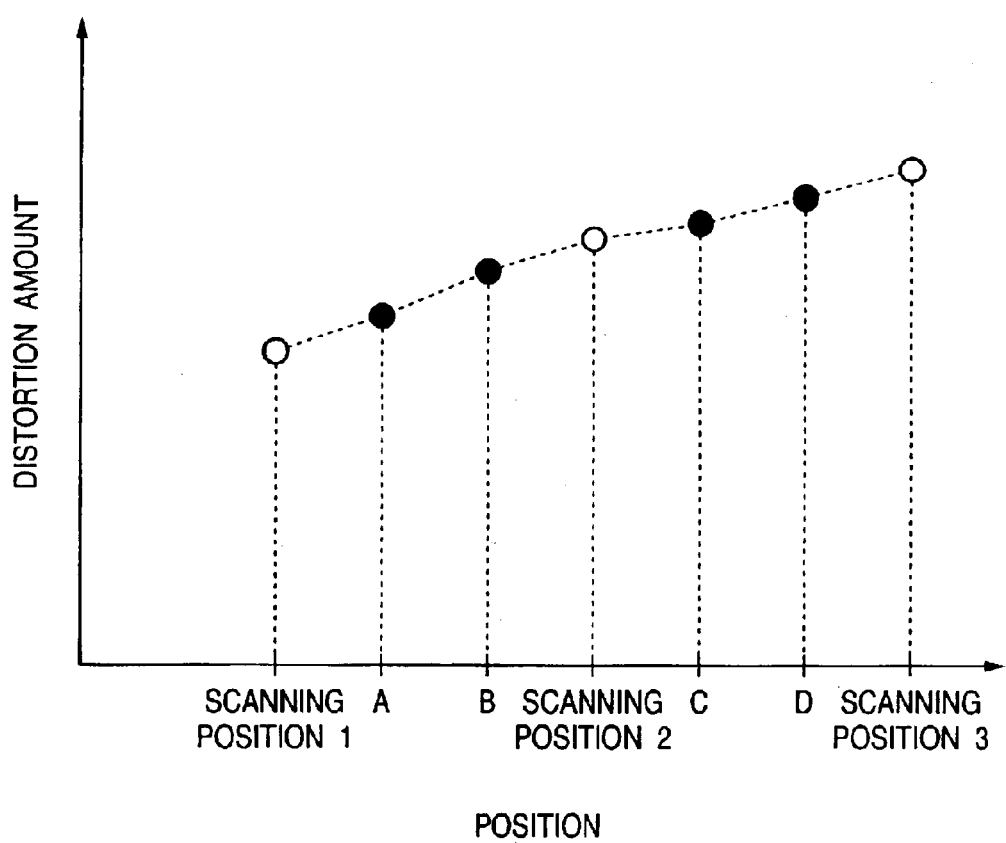
FIG. 9 is an explanatory view for interpolation data.

FIG. 9 is an explanatory view of interpolating the data. The distortion amounts at scanning positions 1, 2 and 3, represented by the blank circles in FIG. 9, are discrete data. For instance, arbitrary interpolation points (A and B in the case of FIG. 9) are provided between the scanning positions 1 and 2. A distortion amount for each of the interpolation points is obtained by approximation using a function passing at least two points (scanning positions 1 and 2). This function may be of linear approximation, or a function of a high order, which takes other conditions, e.g., the scanning position 3, into consideration. The filled circles in FIG. 9 represent distortion amounts at interpolation points (A, B, C, D). By increasing the number of interpolation points, it is possible to obtain a substantially consecutive relation between the scanning position and distortion distribution.

In step S503, an inverse shift averaging process is performed. As a result, an actuator target value related to a scanning position is calculated for an exposure shot based on the inputted distortion for each scanning position and the data obtained by interpolation processing (S504).

In step S505, an actuator's driving target value related to time (frequency) is calculated for the exposure shot, while taking the target value related to the position calculated in step S504 and scanning speed into consideration (S506).

By inversely transforming the actuator's driving target value into a time function, a distribution of the distortion compensation values in the shot can be controlled by frequency components. However, if this target value is used without further processing, synchronization precision may be deteriorated. Therefore, in step S507, filtering is performed by a low-pass filter having a cut-off frequency (S508).

In step S509, the actuator's characteristic is inversely transformed. More specifically, a control input, which can realize the target values obtained in steps S501 to S508, is calculated as an inverse dynamics problem.

Assuming that the dynamic characteristic of the actuator is G(t), control input is x(t), and control target value is Y(t), the following relation stands:

$$Y(t)=G(t) \cdot x(t) \qquad (14)$$

The actuator's target value (Y(t) in equation (14)) is already obtained in steps S501 and S508. By obtaining inverse transformation ($G^{-1}(t)$) of the actuator's characteristic, the compensation driving target value of the actuator, which realizes the actuator's target value, can be calculated.

$$x(t)=G^{-1}(t) \cdot Y(t) \qquad (15)$$

In step S510, the compensation driving target value of the actuator for compensating for a distortion generated in scanning exposure is generated taking the scanning speed into consideration.

Note, among distortion components generated in scanning exposure, a distortion component which changes in an area smaller than the width of exposure light is a distortion not generated in the scanning exposure and cannot be removed completely in the scanning exposure, e.g., a reticle drawing error, or the like. Therefore, with respect to the measured distortions in the scanning direction, unevenness having a shorter cycle than the width of exposure light is removed in advance by a filter, in the stage of step S502, or the like, to achieve more accurate distortion compensation in the scanning exposure.

By selecting a distortion pattern to be corrected by taking a control band of the reticle stage or substrate stage into consideration, it is possible to minimize deterioration of synchronization precision between the reticle and substrate, and accurately perform distortion compensation in the shot. More specifically, verification by simulation shows a result that a distortion can be reduced to less than 10%.

Next, a scanning exposure process applying the above-described compensation is described with reference to the flowcharts in FIGS. 6 and 7.

Figure 6:
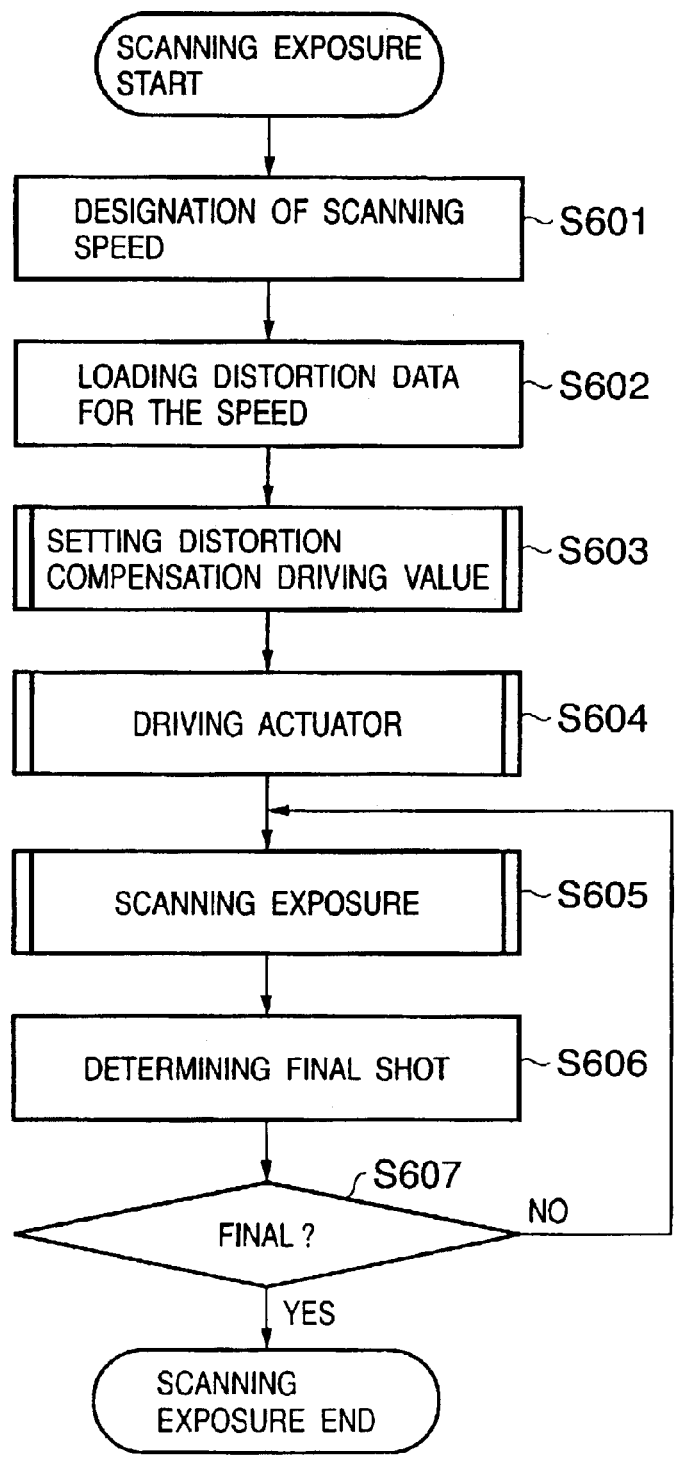
FIG. 6 is a flowchart describing a scanning exposure procedure.

FIG. 6 is a flowchart describing a scanning exposure procedure.

First, in step S601, scanning speed is designated. The designation may be made by using an exposure condition stored in a database (not shown), or may be inputted by an operator through the interface (I/F) 121 of the exposure apparatus.

In step S602, data related to a distortion for the scanning speed, which is designated in step S601, is loaded. The distortion data corresponding to each scanning speed includes the position compensation parameters, which are obtained by measuring a distortion generated as a result of preliminary scanning exposure and separating the distortion into symmetrical and asymmetrical components. The distortion for each scanning speed is obtained in accordance with a procedure described in FIG. 7.

When the scanning speed is designated, a compensation driving value is set with respect to non-compensated distortion original data, which is loaded corresponding to the scanning speed (S603). The compensation driving value set herein is the data calculated in accordance with the procedure shown in FIG. 5, which is obtained in view of the dynamic characteristic of the actuator.

In step S604, if there is an actuator which requires compensation for the scanning exposure, compensation driving is performed prior to the scanning exposure. If there is no actuator which requires compensation, step S604 is not executed.

Then, processing for each shot of the scanning exposure is performed in step S605. When scanning is performed, each actuator is driven in accordance with the distortion compensation driving value obtained in step S603, thereby compensating for a distortion of each shot area.

In step S606, whether or not it is a final shot is determined. If it is not a final shot, scanning exposure for a new substrate area is performed. If it is a final shot, the scanning exposure process ends.

Figure 7:
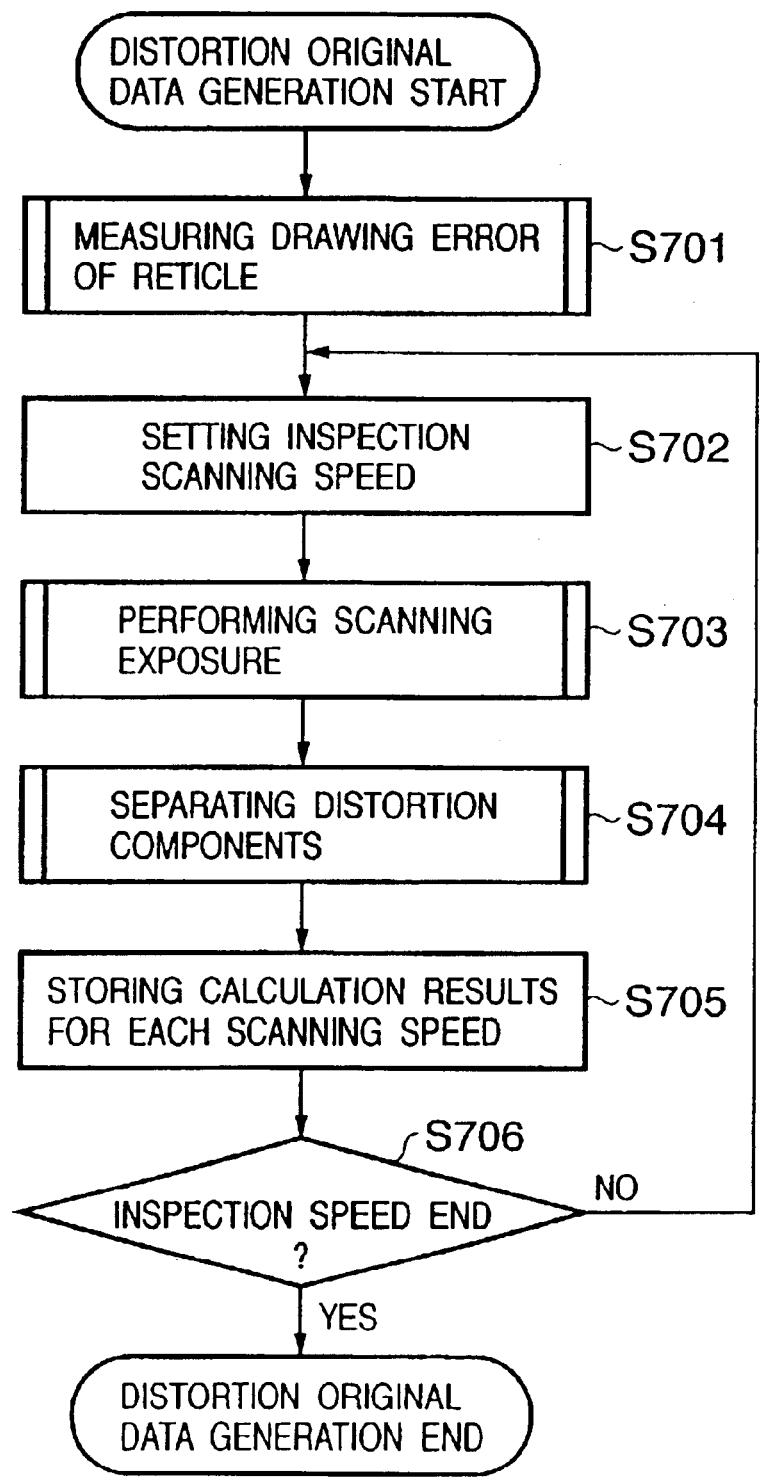
FIG. 7 is a flowchart describing generation of distortion original data.

FIG. 7 is a flowchart describing generation of distortion original data.

In step S701, a drawing error of the reticle is measured and the result is stored. Since the measurement of a drawing error has already been described, a description thereof is omitted herein.

Next, the control proceeds to step S702, and inspection speed for performing distortion measurement by scanning exposure is set.

In step S703, scanning exposure is performed under the set condition. The first layer is exposed by scanning exposure, and the second layer is exposed by driving the stage to a designed layout position of the first layer pattern of the reticle. The amount of distortions of the marks exposed in respective exposure areas is obtained as the distortion of the scanning exposure.

In step S704, the distortion of the scanning exposure is separated into symmetrical and asymmetrical components. With respect to each of the distortion components, parameters are calculated based on the aforementioned equations (1) to (9), and the calculation results are stored in a memory (not shown) for each scanning speed (step S705). The reason that the calculation results are stored for each scanning speed is that, since a distortion generated in scanning exposure is caused by uneven thrust of the stage which holds and drives the reticle or substrate, the characteristic of the distortion changes in accordance with the speed. Therefore, it is necessary to measure a distortion for each scanning speed.

In step S706, it is determined whether or not all the distortion measurement is completed for each scanning speed that should be applied in the scanning exposure. If it is not completed (S706-NO), the control returns to step S702 for measuring a distortion for a new scanning speed. If it is completed (S706-YES), the generation of the distortion original data ends.

As described above, it is useful to store separated distortions for respective factors. Distortions are caused by various factors. There are distortion components caused by, e.g., characteristics of stages, which are independent of the time of measurement, or distortion components caused by environmental factors, which are measured only at the time of measurement. Furthermore, sharing the distortion data by plural machines may be considered. In a case wherein stage generation has a certain peculiarity, sharing the distortion data can contribute to improvement in calculation processes and reduction in the load of distortion sample exposure.

As has been described above, by employing the above-described embodiment, it is possible to perform exposure while effectively compensating for a distortion generated in each shot of scanning exposure.

Furthermore, by employing the above-described embodiment, not only is a generated distortion compensated for, but also a distortion of a background pattern or a drawing error of a reticle can be positively compensated for.

<Embodiment of a Semiconductor Production System>

Next, a description is provided of an example of a production system of semiconductor devices (e.g., semiconductor chips, such as ICs or LSIs, liquid crystal panels, CCDs, thin-film magnetic heads, micro machines, and so on), which employs the apparatus according to the present invention. According to this embodiment, troubleshooting or regular maintenance of manufacturing machines installed in a semiconductor manufacturing factory, or maintenance services, such as supplying software, are performed through a computer network provided outside the factory.

Figure 10:
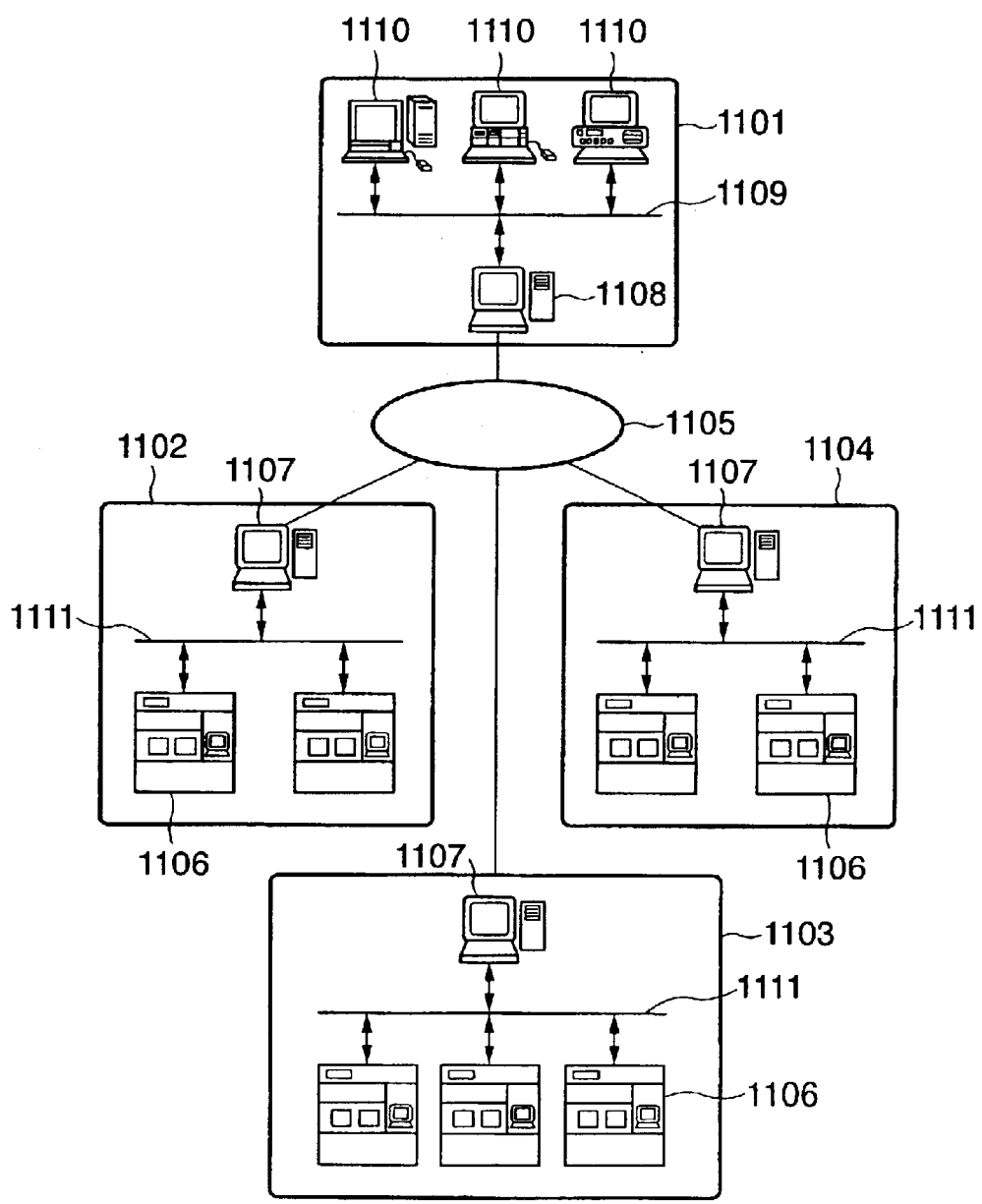
FIG. 10 is a conceptual view of a semiconductor device production system seen from one angle, which employs the apparatus according to the present invention.

FIG. 10 shows an entire semiconductor device production system seen from one angle. Reference numeral 1101 denotes an office of a vendor (supplier) supplying semiconductor device manufacturing machines. Examples of the machines are semiconductor manufacturing machines for performing various processes in a semiconductor manufacturing factory, such as pre-process devices, (e.g., an exposure apparatus, resist processors, a lithography device such as an etching device, a heat processor, a deposition device, a planarization device, and so on) and post-process devices (e.g., an assembly device, an inspection device, and so on). The office 1101 includes a host management system 108 for providing a maintenance database of the manufacturing machines, plural operation terminal computers 1110, and a local area network (LAN) 1109, which constructs an intranet by connecting the aforementioned computers. The host management system 1108 includes a gateway for connecting the LAN 1109 with an external network, i.e., the Internet 1105, and a security function for regulating external access.

Meanwhile, reference numerals 1102 to 1104 denote factories of a semiconductor manufacturer, namely, a user of the manufacturing machines. The manufacturing factories 1102 to 1104 may belong to different manufacturers, or a single manufacturer (e.g., a factory for pre-processes and a factory for post-processes). Each of the factories 1102 to 1104 includes a plurality of manufacturing machines 1106, a local area network (LAN) 1111, which constructs an intranet by connecting the machines 1106, and a host management system 1107 serving as a monitoring apparatus for monitoring an operation status of each manufacturing machine 1106.

The host management system 1107 provided in each of the factories 1102 to 1104 includes a gateway to connect the LAN 1111 of each factory with an external network, i.e., the Internet 1105. By virtue of the above construction, the LAN 1111 of each factory can access the host management system 1108 of the vendor 1101 via the Internet 1106. Access to the host management system 1108 is allowed only to limited users permitted by the security function.

More specifically, status information indicative of an operation status of each manufacturing machine 1106 (e.g., a symptom of an apparatus having trouble) is notified from the factory to the vendor through the Internet 1105, and as a response to the notification (e.g., an instruction to cope with the trouble, or software and data for troubleshooting), maintenance information such as the latest software or help information is transmitted from the vendor to the factory. A communication protocol (TCP/IP) generally used in the Internet is adopted for the data communication between each of the factories 1102 to 1104 and vendor 1101, and for data communication within each factory through the LAN 1111. In place of the Internet, serving as an external network of the factory, a high-security leased-line network (e.g., an ISDN, or the like) that does not allow access of a third party may be used.

Furthermore, the host management system is not limited to the one provided by a vendor. A database constructed by a user may be provided to an external network to allow access from the plural user factories. As one of the status information indicative of operation statuses of the exposure apparatus, the aforementioned evaluation item value, or a determination mode used to obtain the value, a determination condition, and a method of exposure are transmitted to the vendor. The vendor's host management system 1108 or one of the operation terminal computers 1110, which are connected to the system 1108, performs statistical work on the received data, and transmits software to help information appropriate for the status of each exposure apparatus to the factory's host management system 1107.

Moreover, the exposure apparatus may receive values, such as a currently processed lot and wafer process strains (magnification, distortion), as well as dust and an unevenness state of the wafer surface from the vendor or user management system, and the information may be used for switching the exposure method.

Figure 11:
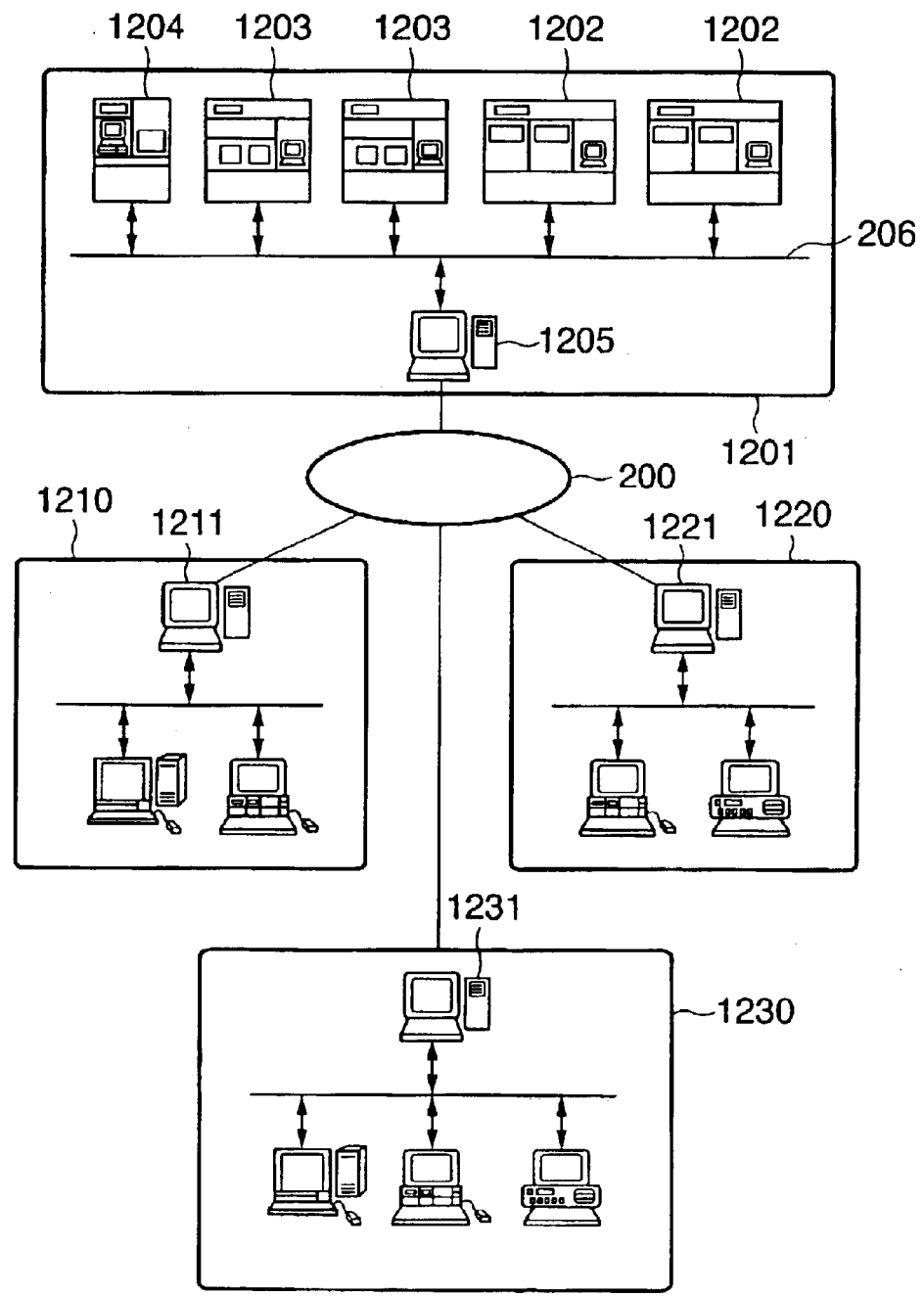
FIG. 11 is a conceptual view of a semiconductor device production system seen from another angle, which employs the apparatus according to the present invention.

FIG. 11 shows an entire semiconductor device production system seen from an angle different from that of FIG. 10. In the above example, plural user factories, each having manufacturing machines, are connected with the management system of the vendor through an external network, to communicate information regarding production management in each factory or information about at least one of the manufacturing machines. On the contrary, in the example shown in FIG. 11, a factory having manufacturing machines of plural different vendors is connected with management systems of respective vendors of the plural manufacturing machines through an external network to communicate maintenance information of each manufacturing machine. In FIG. 11, reference numeral 1201 denotes a manufacturing factory (e.g., a semiconductor device manufacturer), namely, a user of the manufacturing machines. The production line of the factory includes the manufacturing machines for performing various processes, for example, an exposure apparatus 102, a resist processor 1203, and a deposition device 1204. Note that although FIG. 11 shows only one factory 1201, in reality, plural factories are connected through the network. Each of the machines in the factory is connected by a LAN 1206, thereby constructing an intranet. A host management system 1205 controls operation of the production line.

Meanwhile, offices of the respective vendors (suppliers), e.g., exposure apparatus manufacturer 1210, resist processor manufacturer 1220, and deposition device manufacturer 1230, comprise host management systems 1211, 1221, and 1231, respectively, to perform remote maintenance of the respective machines provided. Each host management system has a maintenance database and a gateway to the external network, as mentioned above. The host management system 1205, which manages each machine of the user's factory is connected with the management systems 1211, 1221 and 1231 of the respective vendors through an external network 1200, i.e., the Internet, or a leased-line network. In this system, if trouble occurs in one of the manufacturing machines in the production line, operation of the production line is halted. However, the trouble may quickly be handled by receiving remote maintenance from the vendor of the troubled machined through the Internet 1200. Accordingly, the halt of the production line can be minimized.

Each manufacturing machine installed in the semiconductor manufacturing factory comprises a display monitor, a network interface, software stored in a storage device for accessing a network, and a computer for executing the software to operate the machine. For the storage device, a built-in memory, a hard disk, or a network file server, may be used. The software for accessing a network includes a multipurpose or an exclusive web browser. Such software provides a user interface, such as that shown in FIG. 12, on the display monitor. With the use of this interface, an operator managing the manufacturing machines in each factory inputs information, e.g., a model 1401 of the manufacturing machine, a serial number 1402, a title of the trouble 1403, date 1404, a level of urgency 1405, a symptom 1406, a troubleshooting method 1407, a follow-up 1408, and so on, in the respective areas of the screen.

The inputted information is transmitted to the maintenance database through the Internet, and in response, appropriate maintenance information is returned from the maintenance database and displayed on the monitor. Moreover, the user interface provided by the web browser realizes hyperlink functions 1410 to 1412 shown in FIG. 12. An operator can access more detailed information of each item, download the latest version of the manufacturing machine's software from a software library provided by the vendor, or obtain an operation guide (help information) as a reference for a factory operator. Herein, the maintenance information provided by the maintenance database includes information related to the present invention described above. In addition, the software library provides the latest software for realizing the present invention. As one of the status information indicative of an operation status of a corresponding exposure apparatus, the aforementioned evaluation item value, or a determination mode used to obtain the value, a determination condition, and a method of exposure, are transmitted to the vendor of the exposure apparatus. The vendor's host management system or one of the operation terminal computers, which are connected to the system, performs statistical work on the received data, and transmits software or help information appropriate for the status of the exposure apparatus to the factory's host management system 1205. The host management system 1205 transfers the data only to the corresponding exposure apparatus.

Figure 13:
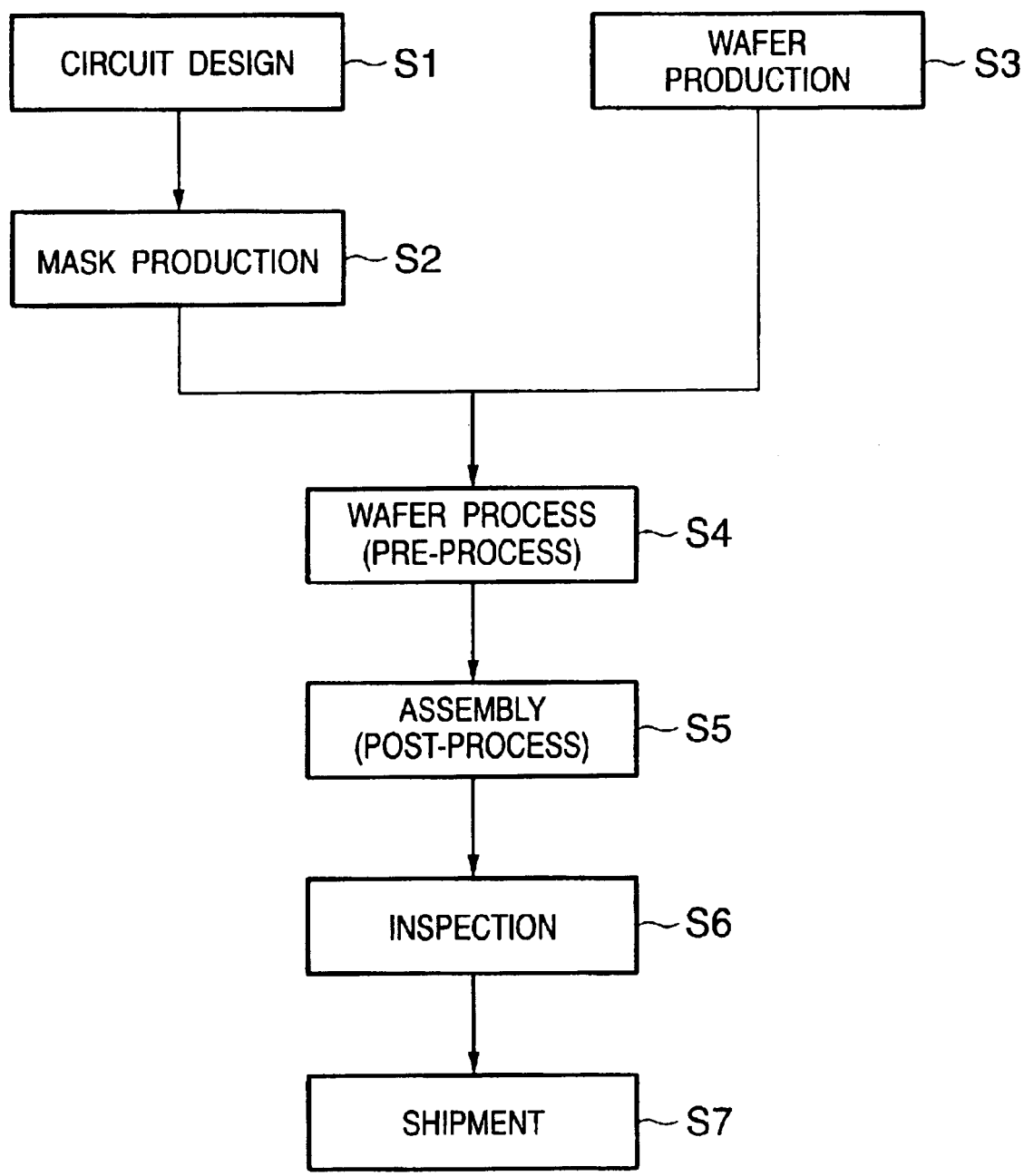
FIG. 13 is a flowchart describing a device manufacturing process.

Next, a semiconductor device manufacturing process using the above-described production system is described. FIG. 13 is a flowchart describing an overall semiconductor device manufacturing process. In step S1 (circuit design), a circuit of a semiconductor device is designed. In step S2 (mask production), a mask, on which the designed circuit pattern is formed, is produced. Meanwhile, in step S3 (wafer production), a wafer is produced with a material such as silicon. In step S4 (wafer process), which is called a pre-process, an actual circuit is formed on the wafer using the mask and wafer by a lithography technique. In step S5 (assembly), which is called a post-process, a semiconductor chip is manufactured using the wafer produced in step S4. Step S5 includes an assembling process (dicing and bonding), a packaging process (chip embedding), and so on. In step S6 (inspection), the semiconductor device manufactured in step S5 is subjected to inspections such as an operation-check test, a durability test, and so on. Semiconductor devices are manufactured in the foregoing processes and shipped (step S7). The pre-process and post-process are performed in separate factories, which are dedicated to respective processes, and maintained by the above-described remote maintenance system for each factory. Between the pre-process factory and post-process factory, information related to production management or apparatus maintenance is communicated through the Internet or a leased-line network.

Figure 14:
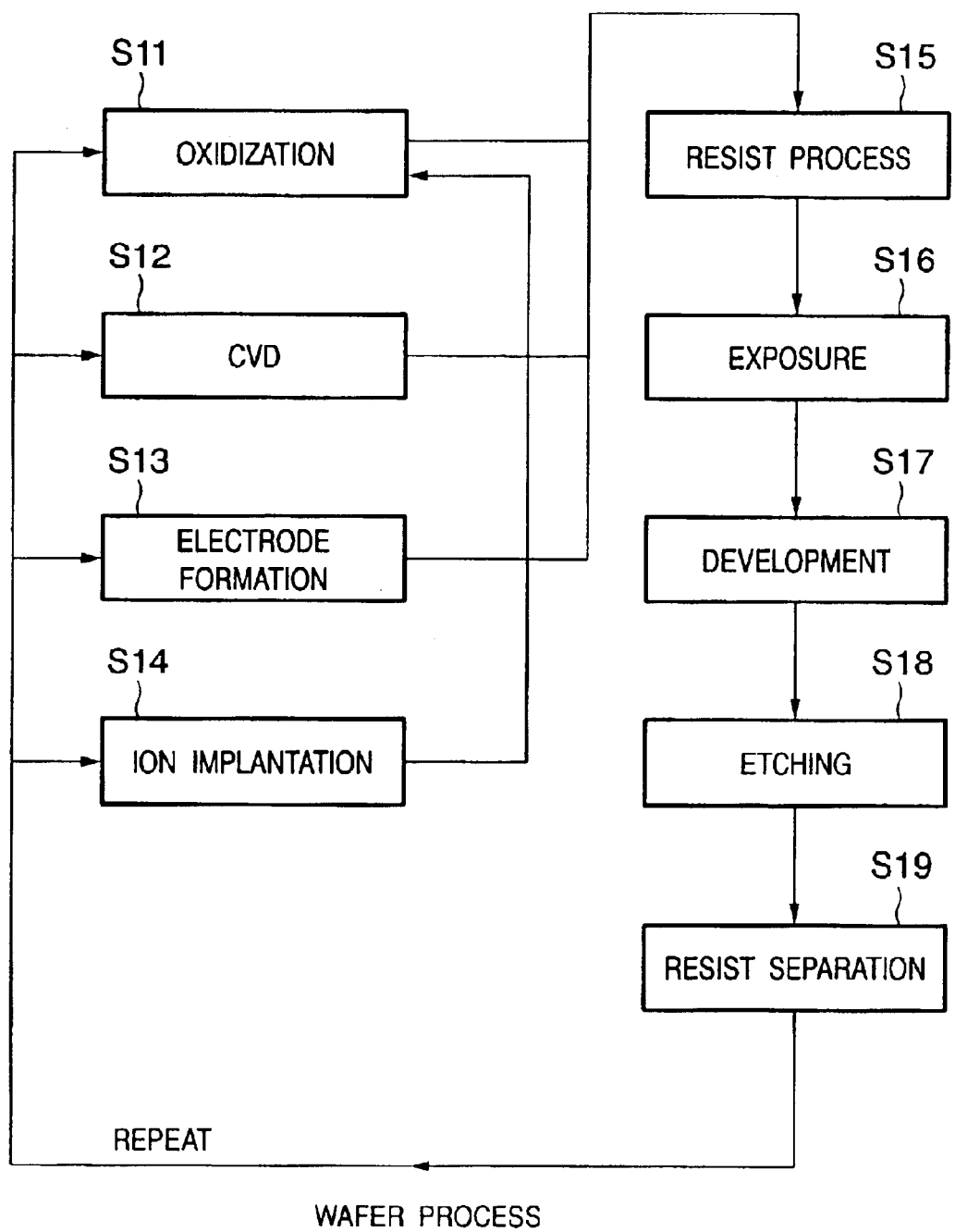
FIG. 14 is a flowchart describing a wafer process.

FIG. 14 is a flowchart describing the aforementioned wafer process in detail. In step S11 (oxidization), the wafer surface is oxidized. In step S12 (CVD), an insulating film is deposited on the wafer surface. In step S13 (electrode formation), electrodes are deposited on the wafer. In step S14 (ion implantation), ions are implanted on the wafer. In step S15 (resist process), a photosensitive agent is coated on the wafer. In step S16 (exposure), the circuit pattern of the mask is exposed on the wafer by the above-described exposure apparatus. In step S17 (development), the exposed wafer is developed. In step S18 (etching), portions other than the developed resist image are removed. In step S19 (resist separation), unnecessary resist after the etching process is removed. By repeating the foregoing steps, multiple circuit pattens are formed on the wafer. Since the manufacturing machines used in respective steps are maintained by the aforementioned remote maintenance system, it is possible to prevent trouble from occurring. Even if trouble occurs, quick recovery is possible. Therefore, productivity of semiconductor devices can be improved.

By virtue of the present invention, it is possible to effectively compensate for a distortion generated in each shot of scanning exposure.

Furthermore, since a generated distortion is quantitatively compensated for, distortion maintenance that has conventionally been difficult to perform can be performed by any person. As a result, it is possible to improve performance of an exposure apparatus.

Moreover, according to the present invention, not only is a generated distortion compensated for, but also, a distortion of a background pattern can be positively compensated for.

As many apparently widely different embodiments of the present invention can be made without departing from the spirit and scope thereof, it is to be understood that the invention is not limited to the specific embodiments thereof except as defined in the claims.

What is claimed is:

1. An exposure apparatus comprising:
    measurement means for measuring a distortion of an image of a reticle formed on a substrate by scanning exposure;
    calculation means for calculating a position compensation parameter for each distortion, by separating the measured distortion into a symmetrical component and an asymmetrical component; and control means for controlling scanning of one of the reticle and the substrate based on the position compensation parameter calculated by said calculation means.

2. An apparatus according to claim 1, wherein the symmetrical component of the distortion is a positional error component of the image, which is concentrically distributed with respect to a reference point.

3. An apparatus according to claim 1, wherein the asymmetrical component of the distortion is a positional error component of the image, which is distributed in at least one of a translational direction and a rotational direction with respect to a reference point.

4. An apparatus according to claim 1, wherein said measurement means measures the distortion with respect to each scanning speed.

5. A scanning exposure apparatus, having a projection optical system, a reticle stage on which a reticle is placed and a substrate stage on which a substrate is placed, for exposing the substrate to a pattern from the reticle through said projection optical system, while scanning said reticle stage and said substrate stage, said apparatus comprising:
first calculation means for calculating a positional error between said reticle stage and said substrate stage during scanning of said reticle stage and said substrate stage, based on previously acquired information of a positional error between a pattern to which the substrate is exposed by said scanning exposure apparatus and a reference pattern; and
second calculation means for calculating a control input used for scanning of one of said reticle stage and said substrate stage, based on the positional error calculated by said first calculation means.

6. An apparatus according to claim 5, wherein said first calculation means calculates the positional error during the scanning based on the information of the positional error corresponding to a target scanning velocity of one of said reticle stage and said substrate stage.

7. An apparatus according to claim 5, wherein said first calculation means comprises interpolation means for interpolating the information of the positional error.

8. An apparatus according to claim 7, wherein said first calculation means calculates the positional error during the scanning based on information of a plurality of positional errors obtained by said interpolation means.

9. An apparatus according to claim 5, wherein said second calculation means comprises third calculation means for calculating a driving target position for scanning of one of said reticle stage and said substrate stage, based on the positional error during the scanning.

10. An apparatus according to claim 9, wherein said second calculation means comprises fourth calculation means for calculating the driving target position as a function of time based on the driving target position calculated by said third calculation means and a target scanning velocity of one of said reticle stage and said substrate stage.

11. An apparatus according to claim 10, wherein said second calculation means comprises a low pass filter which cuts off a high frequency component of the driving target position as the function of time calculated by said fourth calculation means.

12. An apparatus according to claim 11, wherein said second calculation means calculates the control input based on the driving target position as the function of time obtained by said low pass filter and a dynamic characteristic of one of said reticle stage and said substrate stage.

13. An apparatus according to claim 5, further comprising loading means for loading the information of the positional error.

14. An apparatus according to claim 13, wherein said loading means loads the information of the positional error corresponding to a target scanning velocity of one of said reticle stage and said substrate stage.

15. An apparatus according to claim 5, further comprising:
a control system which controls scanning of one of said reticle stage and said substrate stage based on the control input calculated by said second calculation means.

16. An apparatus according to claim 5, further comprising:
third calculation means for calculating the positional error between the pattern to which the substrate is exposed by said scanning exposure apparatus and the reference pattern.

17. An apparatus according to claim 16, wherein said third calculation means calculates a component of the positional error corresponding to a positional error between said reticle stage and said substrate stage.

18. An apparatus according to claim 17, further comprising:
storage means for storing the component of the positional error calculated by said third calculation means with respect to each target scanning velocity of one of said reticle stage and said substrate stage.

19. A device manufacturing method comprising:
a step of exposing a substrate to a pattern using a scanning exposure apparatus as recited in claim 5; and
a step of developing the substrate exposed in said exposing step.

20. A method adapted to a scanning exposure apparatus for exposing a substrate to a pattern from a reticle through a projection optical system, while scanning a reticle stage on which the reticle is placed and a substrate stage on which the substrate is placed, said method comprising:
a first calculation step of calculating a positional error between the reticle stage and the substrate stage during scanning of the reticle stage and the substrate stage, based on previously acquired information of a positional error between a pattern to which the substrate is exposed by the scanning exposure apparatus and a reference pattern; and
a second calculation step of calculating a control input used for scanning of one of the reticle stage and the substrate stage, based on the positional error calculated in said first calculation step.

21. A method according to claim 20, wherein said first calculation step calculates the positional error during the scanning based on the information of the positional error corresponding to a target scanning velocity of one of the reticle stage and the substrate stage.

22. A method according to claim 20, wherein said first calculation step comprises an interpolation step of interpolating the information of the positional error.

23. A method according to claim 22, wherein said first calculation step calculates the positional error during the scanning based on information of a plurality of positional errors obtained in said interpolation step.

24. A method according to claim 20, wherein said second calculation step comprises a third calculation step of calculating a driving target position for scanning of one of the reticle stage and the substrate stage, based on the positional error during the scanning.

25. A method according to claim 24, wherein said second calculation step comprises a fourth calculation step of calculating the driving target position as a function of time based on the driving target position calculated in said third calculation step and a target scanning velocity of one of the reticle stage and the substrate stage.

26. A method according to claim 25, wherein said second calculation step comprises a filtering step of cutting off, with a low pass filter, a high frequency component of the driving target position as the function of time calculated in said fourth calculation step.

27. A method according to claim 26, wherein said second calculation step calculates the control input based on the driving target position as the function of time obtained by the low pass filter and a dynamic characteristic of one of the reticle stage and the substrate stage.

28. A method according to claim 20, further comprising a loading step of loading the information of the positional error.

29. A method according to claim 28, wherein said loading step loads the information of the positional error corresponding to a target scanning velocity of one of the reticle stage and the substrate stage.

30. A method according to claim 20, further comprising:
a control step of controlling scanning of one of the reticle stage and the substrate stage based on the control input calculated in said second calculation step.

31. A method according to claim 20, further comprising:
a third calculation step of calculating the positional error between the pattern to which the substrate is exposed and the reference pattern.

32. A method according to claim 31, wherein said third calculation step calculates a component of the positional error corresponding to a positional error between the reticle stage and the substrate stage.

33. A method according to claim 32, further comprising:
a storage step of storing the component of the positional error calculated in said third calculation step with respect to each target scanning velocity of one of the reticle stage and the substrate stage.

34. A device manufacturing method comprising:
a step of exposing a substrate to a pattern using a method as recited in claim 20.

* * * * *